United States Patent
Liu

(10) Patent No.: US 9,934,350 B2
(45) Date of Patent: *Apr. 3, 2018

(54) PATTERN SELECTION FOR FULL-CHIP SOURCE AND MASK OPTIMIZATION

(71) Applicant: ASML NETHERLANDS B.V., Veldhoven (NL)

(72) Inventor: Hua-Yu Liu, Palo Alto, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 141 days.

This patent is subject to a terminal disclaimer.

(21) Appl. No.: 14/874,134

(22) Filed: Oct. 2, 2015

(65) Prior Publication Data
US 2016/0026750 A1 Jan. 28, 2016

Related U.S. Application Data

(63) Continuation of application No. 13/888,816, filed on May 7, 2013, now Pat. No. 9,183,324, which is a (Continued)

(51) Int. Cl.
 *G06F 17/50* (2006.01)
 *G03F 1/00* (2012.01)
 (Continued)

(52) U.S. Cl.
 CPC .......... *G06F 17/5081* (2013.01); *G03F 1/144* (2013.01); *G03F 1/36* (2013.01);
 (Continued)

(58) Field of Classification Search
 CPC ........ G03F 1/36; G03F 7/70425; G03F 1/144; G03F 7/70441; G03F 7/705;
 (Continued)

(56) References Cited

U.S. PATENT DOCUMENTS 5,229,872 A 7/1993 Mumola
5,296,891 A 3/1994 Volt et al.
(Continued)

FOREIGN PATENT DOCUMENTS

CN 1530755 9/2004
CN 1828614 9/2006
(Continued)

OTHER PUBLICATIONS

C. Spence , "Full-Chip Lithography Simulation and Design Analysis—How OPC Is Changing IC Design", Proc. SPIE, vol. 5751, pp. 1-14 (2005).
(Continued)

*Primary Examiner* — Vuthe Siek
(74) *Attorney, Agent, or Firm* — Pillsbury Winthrop Shaw Pittman LLP

(57) ABSTRACT

The present invention relates to lithographic apparatuses and processes, and more particularly to tools for co-optimizing illumination sources and masks for use in lithographic apparatuses and processes. According to certain aspects, the present invention enables full chip pattern coverage while lowering the computation cost by intelligently selecting a small set of critical design patterns from the full set of clips to be used in source and mask optimization. Optimization is performed only on these selected patterns to obtain an optimized source. The optimized source is then used to optimize the mask (e.g. using OPC and manufacturability verification) for the full chip, and the process window performance results are compared. If the results are comparable to conventional full-chip SMO, the process ends, otherwise various methods are provided for iteratively converging on the successful result.

20 Claims, 20 Drawing Sheets

Related U.S. Application Data continuation of application No. 12/914,946, filed on Oct. 28, 2010, now Pat. No. 8,438,508.

(60) Provisional application No. 61/360,404, filed on Jun. 30, 2010, provisional application No. 61/255,738, filed on Oct. 28, 2009.

(51) Int. Cl.
*G03F 1/36* (2012.01)
*G03F 7/20* (2006.01)

(52) U.S. Cl.
CPC ......... *G03F 7/705* (2013.01); *G03F 7/70125* (2013.01); *G03F 7/70425* (2013.01); *G03F 7/70441* (2013.01); *G03F 7/70666* (2013.01); *G06F 17/50* (2013.01); *G06F 17/5009* (2013.01)

(58) Field of Classification Search
CPC ......... G03F 7/70666; G03F 1/42; G03F 1/44; G03F 7/38; G03F 7/70125; G03F 7/70675; G03F 17/50; G03F 17/5009; G03F 17/5081
See application file for complete search history.

(56) References Cited

U.S. PATENT DOCUMENTS

| | | | |
|---|---|---|---|
| 5,523,193 | A | 6/1996 | Nelson |
| 5,663,893 | A | 9/1997 | Wampler et al. |
| 5,821,014 | A | 10/1998 | Chen et al. |
| 5,969,441 | A | 10/1999 | Loopstra et al. |
| 6,046,792 | A | 4/2000 | Van Der Werf et al. |
| 6,541,167 | B2 | 4/2003 | Peterson et al. |
| 6,670,081 | B2 | 12/2003 | Laidig et al. |
| 6,951,701 | B2 | 10/2005 | Hsu et al. |
| 7,003,758 | B2 | 2/2006 | Ye et al. |
| 7,342,646 | B2 | 3/2008 | Shi et al. |
| 7,587,704 | B2 | 9/2009 | Ye et al. |
| 7,670,730 | B2 | 3/2010 | Streefkerk et al. |
| 8,438,508 | B2 * | 5/2013 | Liu ............... G03F 1/144 716/51 |
| 8,450,046 | B2 | 5/2013 | Ling et al. |
| 8,739,082 | B2 * | 5/2014 | Liu ............... G03F 1/144 716/52 |
| 9,183,324 | B2 * | 11/2015 | Liu ............... G03F 1/144 |
| 2003/0073013 | A1 | 4/2003 | Hsu et al. |
| 2004/0141167 | A1 | 7/2004 | Sasaki |
| 2004/0156030 | A1 | 8/2004 | Hansen |
| 2004/0181768 | A1 | 9/2004 | Krukar |
| 2004/0265707 | A1 | 12/2004 | Socha et al. |
| 2006/0158626 | A1 | 7/2006 | Baselmans et al. |
| 2006/0204090 | A1 | 9/2006 | Socha et al. |
| 2006/0273266 | A1 * | 12/2006 | Preil ............... G03F 1/84 250/548 |
| 2007/0009146 | A1 | 1/2007 | Hoeks et al. |
| 2007/0009814 | A1 | 1/2007 | Oesterholt |
| 2007/0050749 | A1 | 3/2007 | Ye et al. |
| 2007/0121090 | A1 | 5/2007 | Chen et al. |
| 2007/0273853 | A1 * | 11/2007 | Bleeker ........... G03B 27/54 355/46 |
| 2008/0186468 | A1 | 8/2008 | Hansen et al. |
| 2009/0077527 | A1 | 3/2009 | Gergov et al. |
| 2009/0214984 | A1 | 8/2009 | Ling et al. |
| 2009/0268958 | A1 | 10/2009 | Kwang et al. |
| 2009/0271749 | A1 | 10/2009 | Tang et al. |
| 2010/0122225 | A1 | 5/2010 | Cao et al. |
| 2010/0251202 | A1 * | 9/2010 | Pierrat ............. G03F 1/36 716/50 |
| 2010/0315614 | A1 | 12/2010 | Hansen |
| 2011/0047519 | A1 | 2/2011 | Torres Robles et al. |
| 2011/0069292 | A1 | 3/2011 | Den Boef |
| 2011/0099526 | A1 | 4/2011 | Liu |
| 2011/0230999 | A1 | 9/2011 | Chen et al. |

FOREIGN PATENT DOCUMENTS

| | | |
|---|---|---|
| JP | 2002-261004 | 9/2002 |
| JP | 2003-178966 | 6/2003 |
| JP | 2004-247737 | 9/2004 |
| JP | 2004-312027 | 11/2004 |
| JP | 2005-183981 | 7/2005 |
| JP | 2006-191079 | 7/2006 |
| JP | 2006-324695 | 11/2006 |
| JP | 2007-158328 | 6/2007 |
| JP | 2009-105453 | 5/2009 |
| JP | 2009-229812 | 10/2009 |
| JP | 2010-117716 | 5/2010 |
| JP | 2011-100121 | 5/2011 |
| JP | 2011-100122 | 5/2011 |
| KR | 10-2004-0073364 | 8/2004 |
| KR | 10-0881127 | 2/2009 |
| TW | 200942991 | 10/2009 |
| WO | 2004/090952 | 10/2004 |
| WO | 2011/051249 | 5/2011 |

OTHER PUBLICATIONS

Cao, et al., "Optimized Hardware and Software for Fast, Full Chip Simulation", Proc. SPIE, vol. 5754, 405 (2005).

Rosenbluth et al., titled "Optimum Mask and Source Patterns to Print a Given Shape", Journal of Microlithography, Microfabrication, Microsystems 1(1), pp. 13-20, (2002).

Granik, titled "Source Optimization for Image Fidelity and Throughput", Journal of Microlithography, Microfabrication, Microsystems 3(4), pp. 509-522, (2004).

Socha et. al. "Simultaneous Source Mask Optimization (SM0)", Proc. SPIE, vol. 5853, 2005, pp. 180-193.

International Search Report dated Mar. 23, 2011 in corresponding International Patent Application No. PCT/EP2010/066106.

Kehan Tian et al., "Benefits and Trade-Offs of Global Source Optimization in Optical Lithography," Proc. of SPIE, vol. 7274, pp. 72740C-1-72740C-5 (Mar. 16, 2009).

Tamer H. Coskun et al., "Enabling process window improvement at 45nm and 32nm with free-form DOE illumination," Proc. of SPIE, vol. 7274, pp. 72740B-1-72740B-4 (Mar. 16, 2009).

Alan E. Rosenbluth et al., "Intensive Optimization of Masks and Sources for 22nm Lithography," Proc. of SPIE, vol. 7274, pp. 727409-10-727409-14 (Mar. 16, 2009).

Korean Office Action dated Dec. 19, 2011 in corresponding Korean Patent Application No. 10-2010-0105087.

Japanese Office Action dated Jun. 15, 2012 in corresponding Japanese Patent Application No. 2010-235012.

Japanese Office Action dated Jun. 22, 2012 in corresponding Japanese Patent Application No. 2010-235013.

U.S. Office Action dated Aug. 6, 2012 in corresponding U.S. Appl. No. 12/914,954.

U.S. Office Action dated May 2, 2013 in corresponding U.S. Appl. No. 13/505,286.

\* cited by examiner

PATTERN SELECTION FOR FULL-CHIP SOURCE AND MASK OPTIMIZATION

This application is a continuation of U.S. patent application Ser. No. 13/888,816, filed on May 7, 2013, which is a continuation of U.S. patent application Ser. No. 12/914,946 filed on Oct. 28, 2010, and issued as U.S. Pat. No. 8,438,508, which claims priority from U.S. Provisional Patent Application No. 61/255,738, filed on Oct. 28, 2009, and U.S. Provisional Patent Application No. 61/360,404, filed on Jun. 30, 2010, the contents of each of each of the foregoing applications is incorporated herein by reference in its entirety.

FIELD

The present invention relates to lithographic apparatuses and processes, and more particularly to methods for optimizing illumination sources and masks for use in lithographic apparatuses and processes.

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD = k_1 \times \lambda / NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis—How OPC Is Changing IC Design", C. Spence, Proc. SPIE, Vol. 5751, pp 1-14 (2005) provides an overview of current 'model-based' optical proximity correction processes. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

The application of model-based OPC to a target design requires good process models and considerable computational resources, given the many millions of features typically present in a chip design. However, applying OPC is generally not an 'exact science', but an empirical, iterative process that does not always resolve all possible weaknesses on a layout. Therefore, post-OPC designs, i.e. mask layouts after application of all pattern modifications by OPC and any other resolution enhancement techniques (RET's), need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005).

In addition to performing the foregoing mask adjustments (e.g., OPC) in an effort to optimize the imaging results, the illumination scheme utilized in the imaging process can be also optimized, either jointly with mask optimization or separately, in an effort to improve the overall lithography fidelity. Since the 1990s, many off-axis light sources, such as annular, quadrupole, and dipole, have been introduced, and have provided more freedom for OPC design, thereby improving the imaging results. As is known, off-axis illumination is a proven way to resolve fine structures (i.e., target features) contained in the mask. However, when compared to a traditional illuminator, an off-axis illuminator usually provides less light intensity for the aerial image (AI). Thus, it becomes necessary to attempt to optimize the illuminator to achieve the optimal balance between finer resolution and reduced light intensity.

Numerous prior art illumination optimization approaches are known. For example, in an article by Rosenbluth et al., titled "Optimum Mask and Source Patterns to Print A Given Shape", Journal of Microlithography, Microfabrication, Microsystems 1(1), pp. 13-20, (2002), the source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as y in Granik's method, which dictates the trade-off between optimizing the source for wafer image fidelity and the smoothness requirement of the source.

For low k1 photolithography, optimization of both source and mask (i.e. source and mask optimization or SMO) is needed to ensure a viable process window for printing critical patterns. Existing algorithms (e.g. Socha et. al. Proc. SPIE vol. 5853, 2005, p. 180) generally discretize illumination into independent source points and mask into diffraction orders in the spatial frequency domain, and separately formulate a cost function based on process window metrics such as exposure latitude which can be predicted by optical imaging models from source point intensities and mask diffraction orders. Then standard optimization techniques are used to minimize the objective function.

Such conventional SMO techniques are computationally expensive, especially for complicated designs. Accordingly, it is generally only practical to perform source optimization for simple repeating designs such as memory designs (Flash, DRAM and SRAM). Meanwhile, the full chip includes other more complicated designs such as logic and gates. So, since the SMO source optimization is only based on limited small areas of certain designs, it is difficult to guarantee that the source will work well for the designs that are not included in the SMO process. Accordingly, a need remains for a technique that can optimize a source for multiple clips of designs representing all the complicated design layouts in the full chip within a practical amount of run time.

SUMMARY

The present invention relates to lithographic apparatuses and processes, and more particularly to tools for co-optimizing illumination sources and masks for use in lithographic apparatuses and processes. According to certain aspects, the present invention enables full chip pattern coverage while lowering the computation cost by intelligently selecting a small set of critical design patterns from the full set of clips to be used in source and mask optimization. Optimization is performed only on these selected patterns to obtain an optimized source. The optimized source is then used to optimize the mask (e.g. using OPC and manufacturability verification) for the full chip, and the process window performance results are compared. If the results are comparable to conventional full-chip SMO, the process ends, otherwise various methods are provided for iteratively converging on the successful result.

In furtherance of these and other aspects, a method for optimizing a lithographic process for imaging a portion of a design onto a wafer includes identifying a full set of clips from the design, selecting a subset of clips from the full set of clips, optimizing an illumination source for the lithographic process for imaging the selected subset of clips, and using the optimized illumination source for optimizing the full set of clips for being imaged in the lithographic process.

In additional furtherance of the above and other aspects, the selecting step of the method includes calculating diffraction order distributions for each of the full set of clips, grouping the full set of clips into a plurality of groups based on the calculated diffraction order distributions, and selecting one or more representative clips from each of the groups as the subset.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PREFERRED EMBODIMENTS

Figure 1:
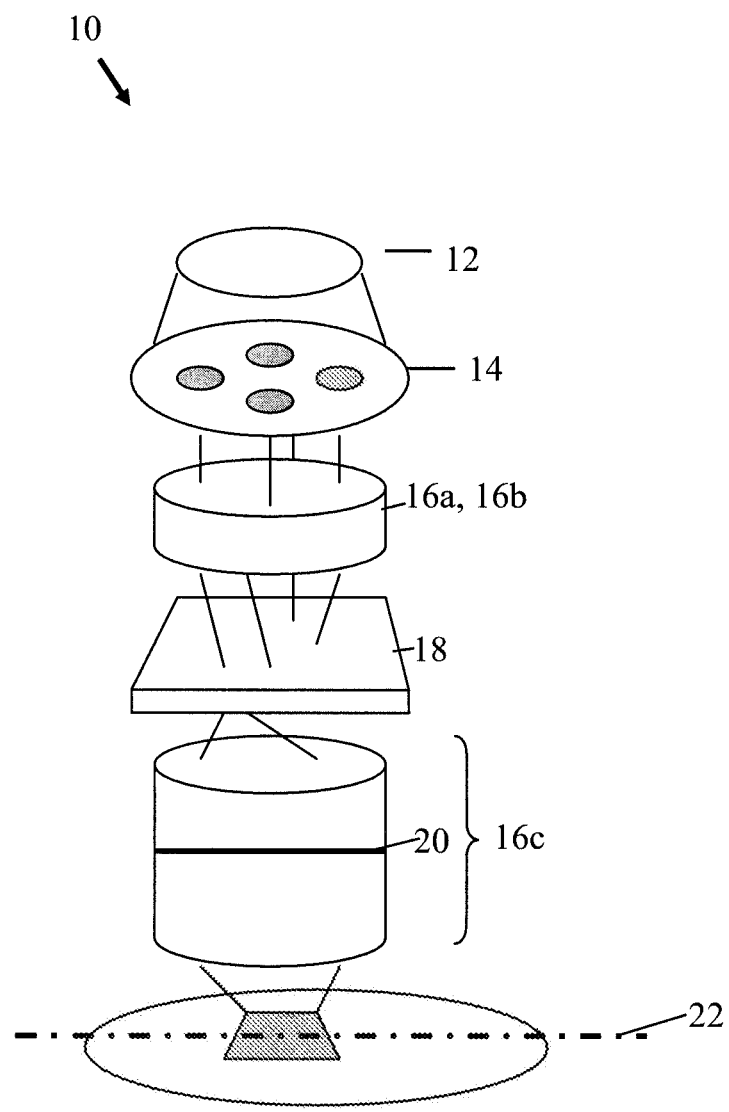
FIG. 1 is an exemplary block diagram illustrating a typical lithographic projection system.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

- a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

Prior to discussing the present invention, a brief discussion regarding the overall simulation and imaging process is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\theta_{max})$.

Figure 2:
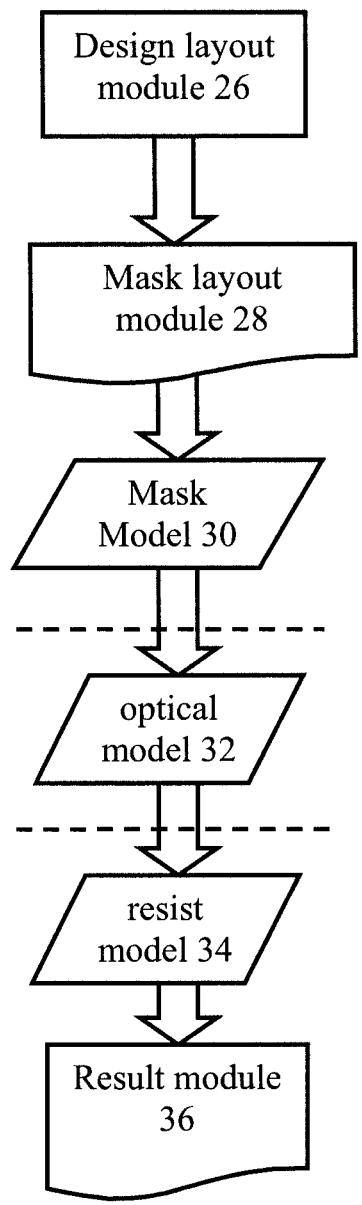
FIG. 2 is an exemplary block diagram illustrating the functional modules of a lithographic simulation model.

In a lithography simulation system, these major system components can be described by separate functional modules, for example, as illustrated in FIG. 2. Referring to FIG. 2, the functional modules include the design layout module 26, which defines the target design; the mask layout module 28, which defines the mask to be utilized in the imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma (σ) settings as well as any particular illumination source shape (e.g. off-axis light sources such as annular, quadrupole, and dipole, etc.). The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask, as described, for example, in U.S. Pat. No. 7,587,704. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS.

In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature. Furthermore, optimization techniques applied to the source of illumination may have different effects on different edges and features. Optimization of illumination sources can include the use of pupils to restrict source illumination to a selected pattern of light. The present invention provides optimization methods that can be applied to both source and mask configurations.

In general, a method of performing source and mask optimization (SMO) according to embodiments of the invention enables full chip pattern coverage while lowering the computation cost by intelligently selecting a small set of critical design patterns from the full set of clips to be used in SMO. SMO is performed only on these selected patterns to obtain an optimized source. The optimized source is then used to optimize the mask (e.g. using OPC and LMC) for the full chip, and the results are compared. If the results are comparable to conventional full-chip SMO, the process ends, otherwise various methods are provided for iteratively converging on the successful result.

One example SMO method according to embodiments of the invention will be explained in connection with the flowchart in FIG. 3.

A target design 300 (typically comprising a layout in a standard digital format such as OASIS, GDSII, etc.) for which a lithographic process is to be optimized includes memory, test patterns and logic. From this design, a full set of clips 302 is extracted, which represents all the complicated patterns in the design 300 (typically about 50 to 1000 clips). As will be appreciated by those skilled in the art, these clips represent small portions (i.e. circuits, cells or patterns) of the design for which particular attention and/or verification is needed.

As generally shown in 304, a small subset of clips 306 (e.g. 15 to 50 clips) is selected from the full set 302. As will be explained in more detail below, the selection of clips is preferably performed such that the process window of the selected patterns as closely as possible matches the process window for the full set of critical patterns. The effectiveness of the selection is also measured by the total turn run time (pattern selection and SMO) reduction.

In 308, SMO is performed with the selected patterns (15 to 50 patterns) 306. More particularly, an illumination source is optimized for the selected patterns 306. This optimization can be performed using any of a wide variety of known methods, for example those described in U.S. Patent Pub. No. 2004/0265707, the contents of which are incorporated herein by reference.

In 310, manufacturability verification of the selected patterns 306 is performed with the source obtained in 308. More particularly, verification includes performing an aerial image simulation of the selected patterns 306 and the optimized source and verifying that the patterns will print across a sufficiently wide process window. This verification can be performed using any of a wide variety of known methods, for example those described in U.S. Pat. No. 7,342,646, the contents of which are incorporated herein by reference.

If the verification in 310 is satisfactory, as determined in 312, then processing advances to full chip optimization in 314. Otherwise, processing returns to 308, where SMO is performed again but with a different source or set of patterns. For example, the process performance as estimated by the verification tool can be compared against thresholds for certain process window parameters such as exposure latitude and depth of focus. These thresholds can be predetermined or set by a user.

In 316, after the selected patterns meet lithography performance spec as determined in 312, the optimized source 314 will be used for optimization of the full set of clips.

In 318, model-based sub-resolution assist feature placement (MB-SRAF) and optical proximity correction (OPC) for all the patterns in the full set of clips 316 is performed. This process can be performed using any of a wide variety of known methods, for example those described in U.S. Pat. Nos. 5,663,893, 5,821,014, 6,541,167 and 6,670,081.

In 320, using processes similar to step 310, full pattern simulation based manufacturability verification is performed with the optimized source 314 and the full set of clips 316 as corrected in 318.

In 322, the performance (e.g. process window parameters such as exposure latitude and depth of focus) of the full set of clips 316 is compared against the subset of clips 306. In one example embodiment, the pattern selection is considered complete and/or the source is fully qualified for the full chip when the similar (<10%) lithography performances are obtained for both selected patterns (15 to 20) 306 and all critical patterns (50 to 1000) 316.

Otherwise, in 324, hotspots are extracted, and in 326 these hotspots are added to the subset 306, and the process starts over. For example, hotspots (i.e. features among the full set of clips 316 that limit process window performance) identified during verification 320 are used for further source tuning or to re-run SMO. The source is considered fully converged when the process window of the full set of clips 316 are the same between the last run and the run before the last run of 322.

Multiple pattern selection methods have been developed for use in 304, and certain non-limiting examples are detailed below.

In a first embodiment, a source is optimized for SRAM patterns in the target design, then hotspots among the full set of clips are identified and selected as the subset of patterns for SMO.

Figure 4:
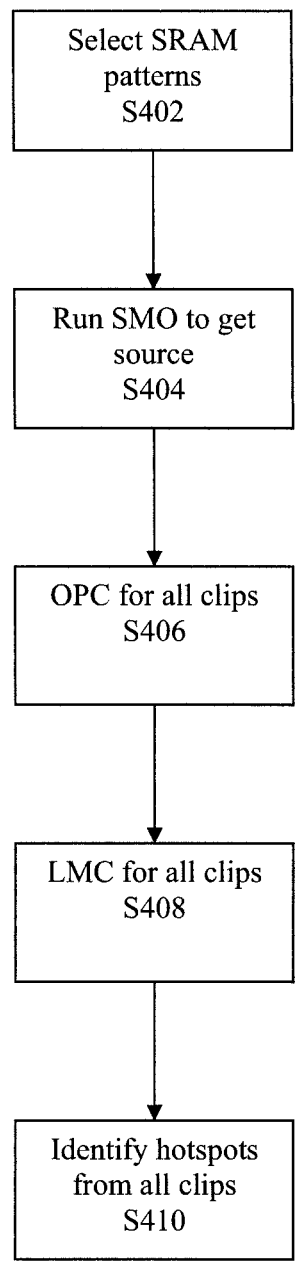
FIG. 4 is a flowchart illustrating an example pattern selection method that can be included in one embodiment of an SMO process according to the invention.

For example, as shown in FIG. 4, the pattern selection according to this embodiment begins in S402 by selecting SRAM patterns from the target design 300, for example two SRAM patterns.

In step S404, source optimization such as that performed in 308 is performed using these two patterns to obtain an optimized source for the SRAM patterns.

In step S406, OPC is performed on the full set of clips 302 using the optimized source from S404. The OPC process performed in this step can be similar to that described above in connection 318 of FIG. 3.

In step S408, manufacturability verification is performed for the full set of clips 302 that have been adjusted in S406. This verification can be performed similarly to that described above in connection with 320 in FIG. 3.

From the manufacturability verification results, the clips having the worst performance are selected in S410. For example, S410 includes identifying from the manufacturability verification results the five to fifteen clips that have the most limiting effect on the process window for the SRAM-optimized source.

Figure 3:
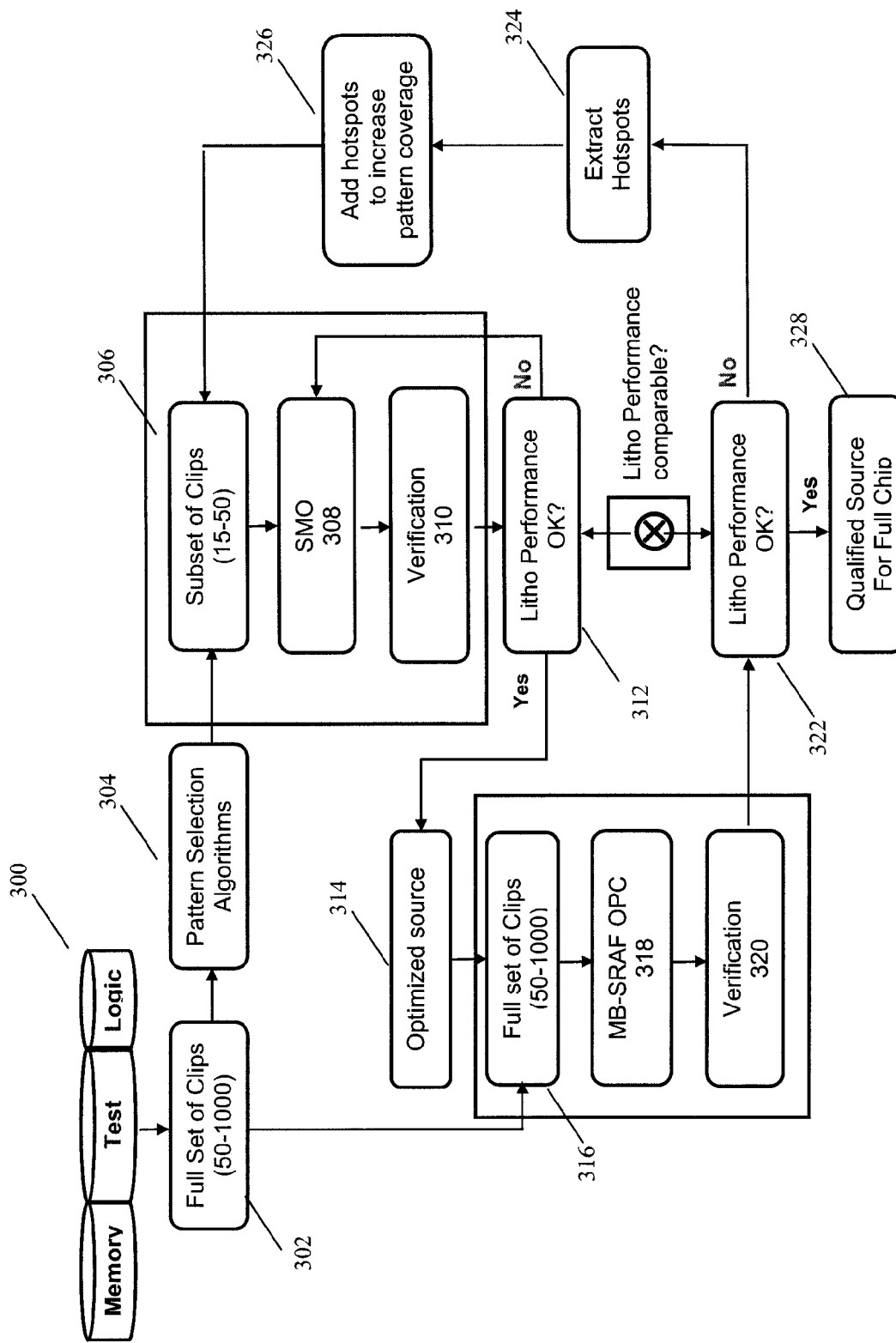
FIG. 3 is a flowchart illustrating an example SMO process according to embodiments of the invention.

The SRAM patterns and hotspots are then used as the subset 306 in the example full-chip SMO flow of FIG. 3.

In a next embodiment, with an original source and model, hotspots are identified from the full set of clips, and these are selected as the subset of patterns for SMO.

Figure 5:
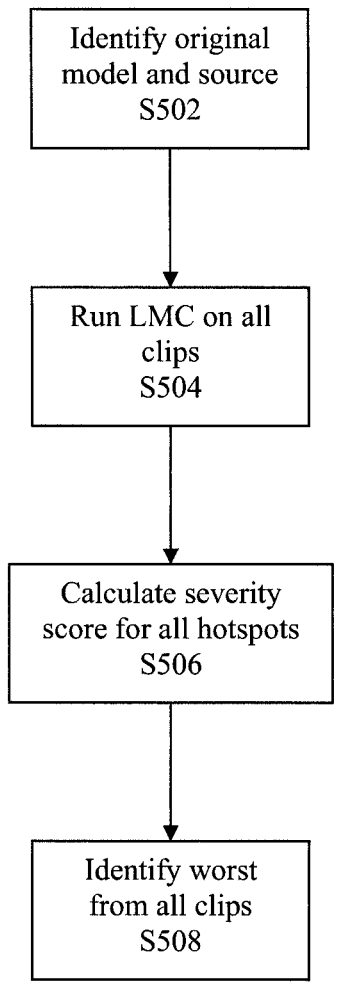
FIG. 5 is a flowchart illustrating an example pattern selection method that can be included in another embodiment of an SMO process according to the invention.

For example, as shown in FIG. 5, the pattern selection according to this embodiment begins in S502 by identifying the original source and model for the lithographic process. For example, an annular illumination source is used as the initial source. The model can be any model of the lithographic process used in computational lithography and aerial image simulation, and can include Transmission Cross Coefficients (TCCs) as described, for example in U.S. Pat. No. 7,342,646.

In step S504, manufacturability verification is performed using the source and model and the full set of clips 302. The verification processing can be similar to that described above in connection with 310 in FIG. 3.

In step S506, a severity score is calculated using the verification results for each of the full set of clips 302 to identify hotspots. In one non-limiting example, the severity score is calculated as:

$$\text{Score} = \text{Normalized}(+EPE) + \text{Normalized}(-EPE) + 2*\text{Normalized MEEF}$$

where EPE is edge placement error and MEEF is mask error enhancement factor.

In step S508, the clips having the highest score are identified as hotspots. For example, S508 includes identifying the five to fifteen clips that have the highest severity score as calculated above.

These clips are then used as the subset 306 in the example full-chip SMO flow of FIG. 3. In embodiments, two SRAM patterns from target design 300 are also included in the subset 306.

In a next embodiment, an analysis is performed on the full set of clips 302, and those clips giving the best feature and pitch coverage are selected as the subset of patterns for SMO.

Figure 6:
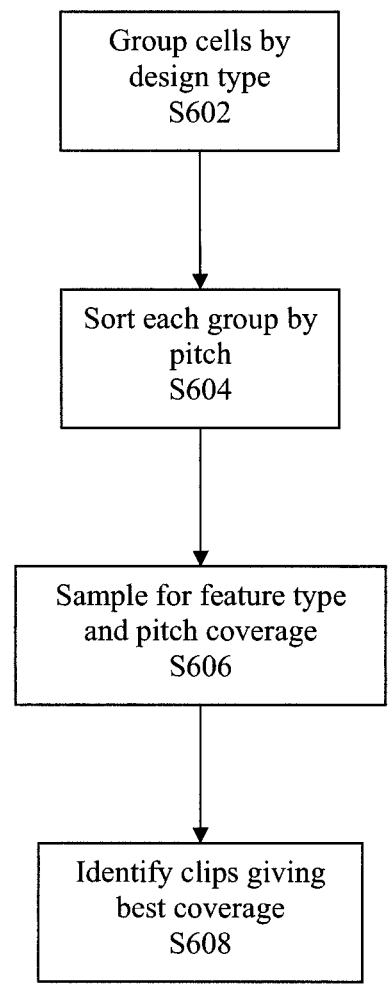
FIG. 6 is a flowchart illustrating an example pattern selection method that can be included in another embodiment of an SMO process according to the invention.

For example, as shown in FIG. 6, the pattern selection according to this embodiment begins in S602 by grouping the clips according to feature type. For example, the clips can be grouped by the type of circuit pattern (e.g. gates or logic) or by orientation or complexity, etc.

In step S604, the clips in each group are further sorted by pitch.

In step S606, each of the clips is sampled in the small pitch zone to determine the coverage that will be provided for both type and pitch.

In step S608, the clips having the minimum pitch and highest cell density are selected from among those giving the desired coverage in S606. For example, S608 includes identifying the five to fifteen clips that have the best design coverage and pitches from minimum to 1.5 times the minimum pitch.

These clips are then used as the subset 306 in the example full-chip SMO flow of FIG. 3. In embodiments, two SRAM patterns from target design 300 are also included in the subset 306.

In a next embodiment, an analysis is performed on the full set of clips, and those clips having the highest sensitivity to certain process parameters according to an original model of the process are selected as the subset of patterns for SMO.

Figure 7:
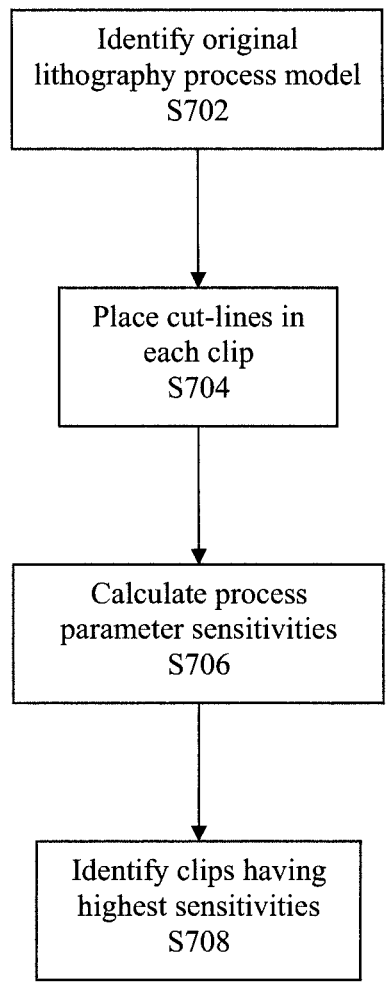
FIG. 7 is a flowchart illustrating an example pattern selection method that can be included in another embodiment of an SMO process according to the invention.

For example, as shown in FIG. 7, the pattern selection according to this embodiment begins in S702 by identifying the original model for the lithography process. Similar to S502, the model can be any model of the lithographic process used in computational lithography and aerial image simulation, and can include Transmission Cross Coefficients (TCCs) as described, for example in U.S. Pat. No. 7,342,646.

In step S704, cut-lines are placed in patterns located at the center of each of the full set of clips 302.

In step S706, process parameter sensitivities are calculated for each of the clips using the original model. For example, the process parameters can be dose and focus, and the sensitivities can be calculated by running aerial image simulation using the lithographic process simulation model identified in S702. The behavior of the clips at the cut lines during various process conditions are then analyzed to determine their sensitivities.

In step S708, the clips having the highest sensitivity to process parameter variations are selected. For example, S708 includes identifying the five to fifteen clips that have the highest sensitivity to changes in dose and focus.

These clips are then used as the subset 306 in the example full-chip SMO flow of FIG. 3. In embodiments, two SRAM patterns from target design 300 are also included in the subset 306.

In a next embodiment, an analysis is performed on the full set of clips, and those clips providing the best diffraction order distribution are selected as the subset of patterns for SMO. Diffraction orders of patterns are known to those skilled in the art, and can be determined for example, as described in U.S. Patent Pub. No. 2004/0265707.

Figure 8:
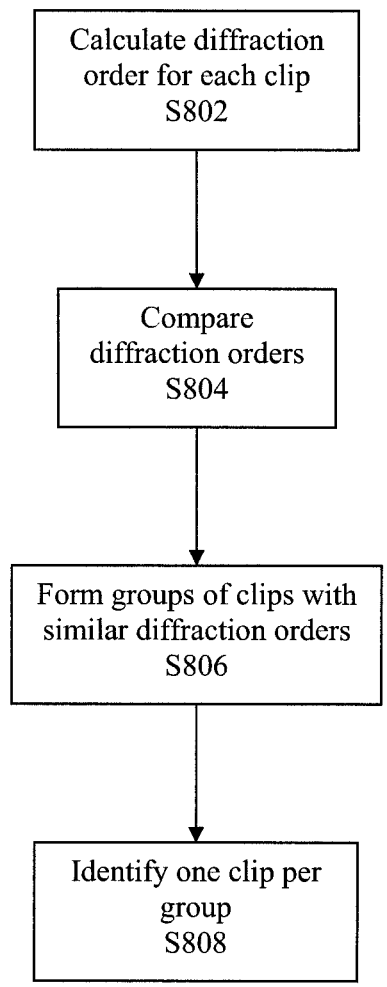
FIG. 8 is a flowchart illustrating an example pattern selection method that can be included in another embodiment of an SMO process according to the invention.

For example, as shown in FIG. 8, the pattern selection according to this embodiment begins in S802 by calculating the diffraction order behavior for each of the full set of clips 302. Numerous possible methods can be used to calculate the diffraction order behavior, for example, U.S. Patent Pub. No. 2004/0265707.

In step S804, the calculated diffraction orders of the full set of clips are compared and in step S806, the clips are grouped according to their diffraction order distribution. For example, a geometrical correlation between each of the clips can be calculated, and sorting methods can be performed to group the most similar clips together.

Figure 9B:
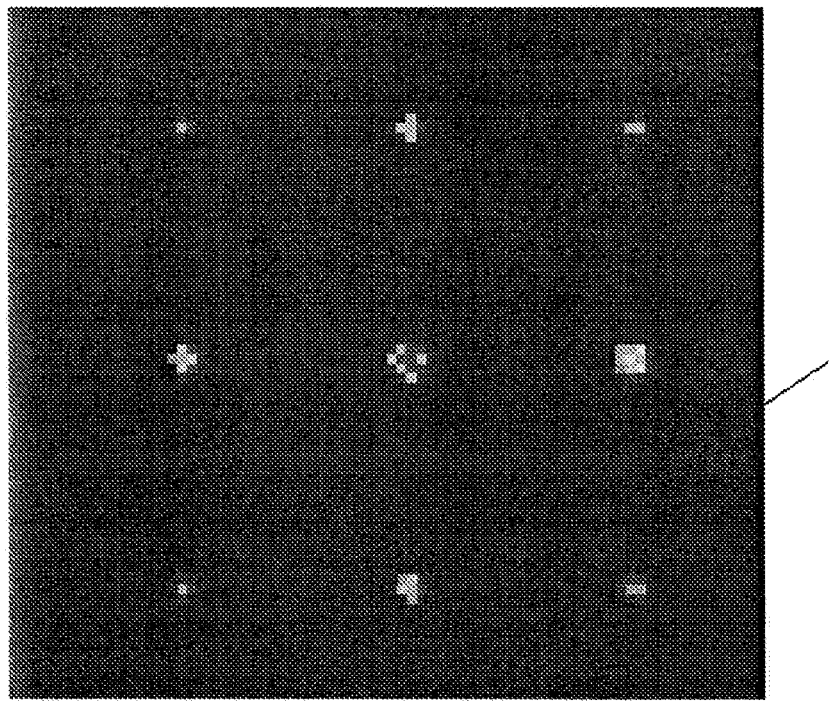
FIGS. 9A-9O illustrate example diffraction order distribution of fifteen clips selected according to the method in FIG. 8.
Figure 9A:
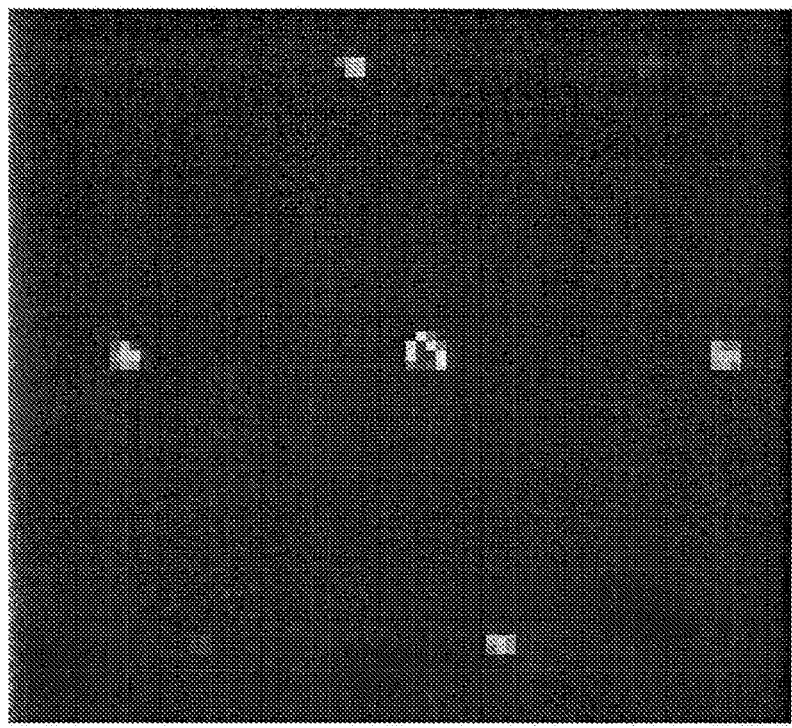
Figure 9D:
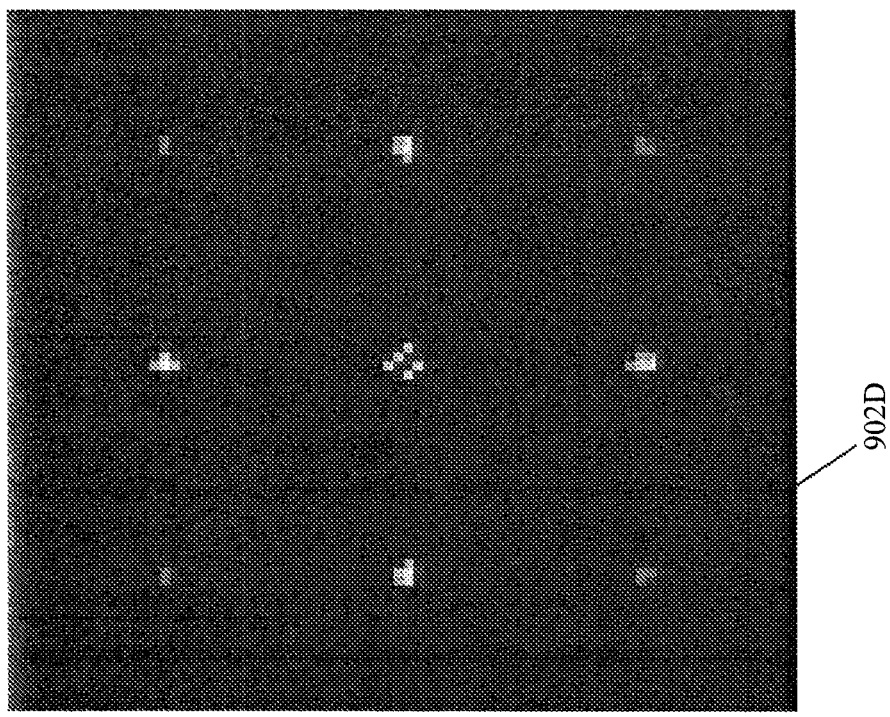
Figure 9C:
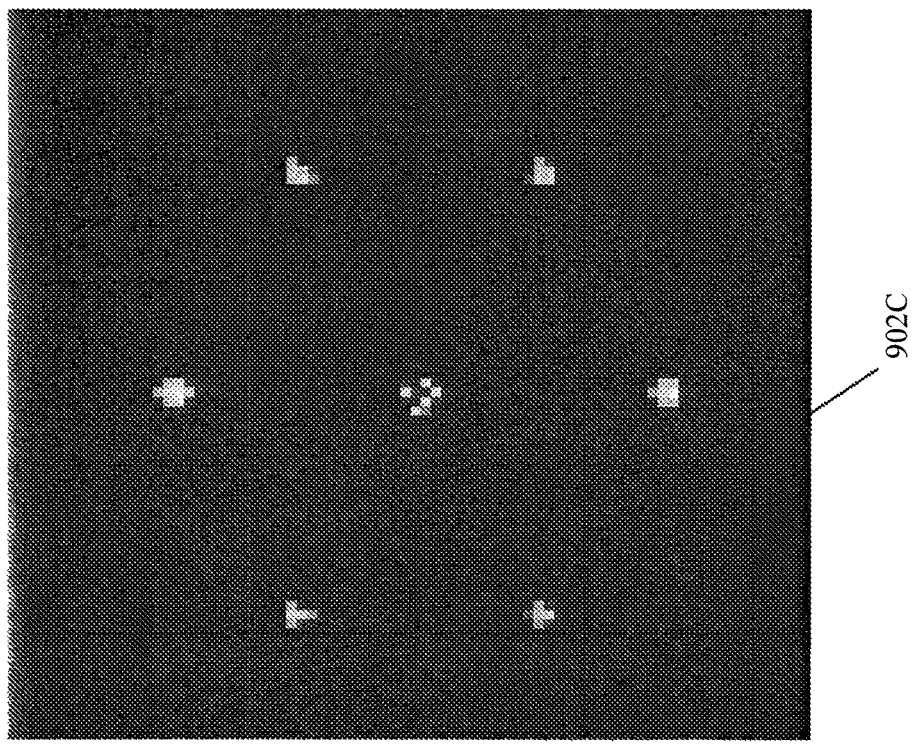
Figure 9F:
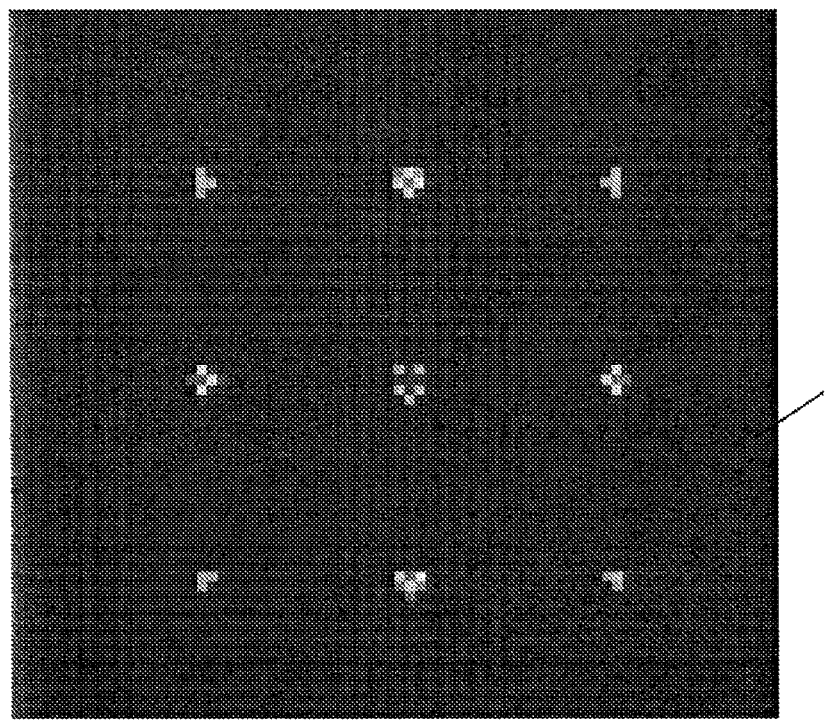
Figure 9E:
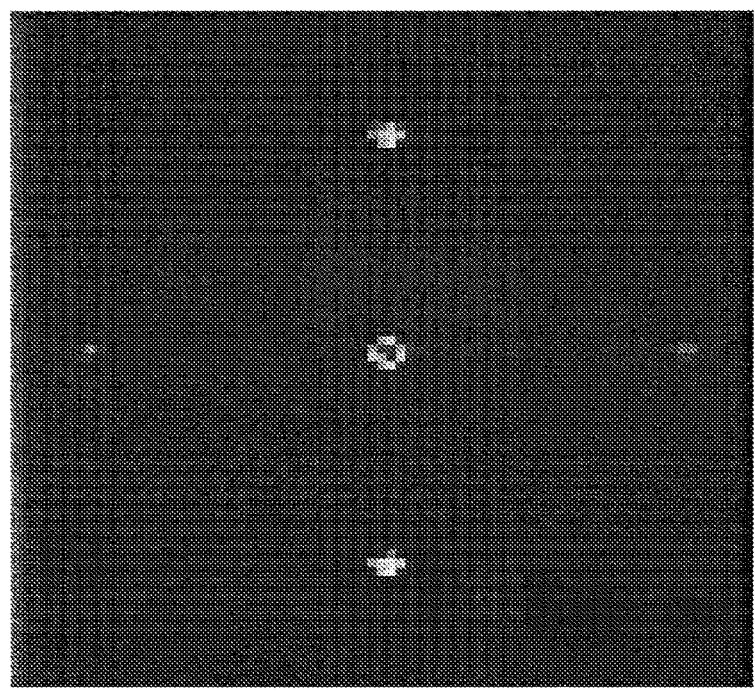
Figure 9H:
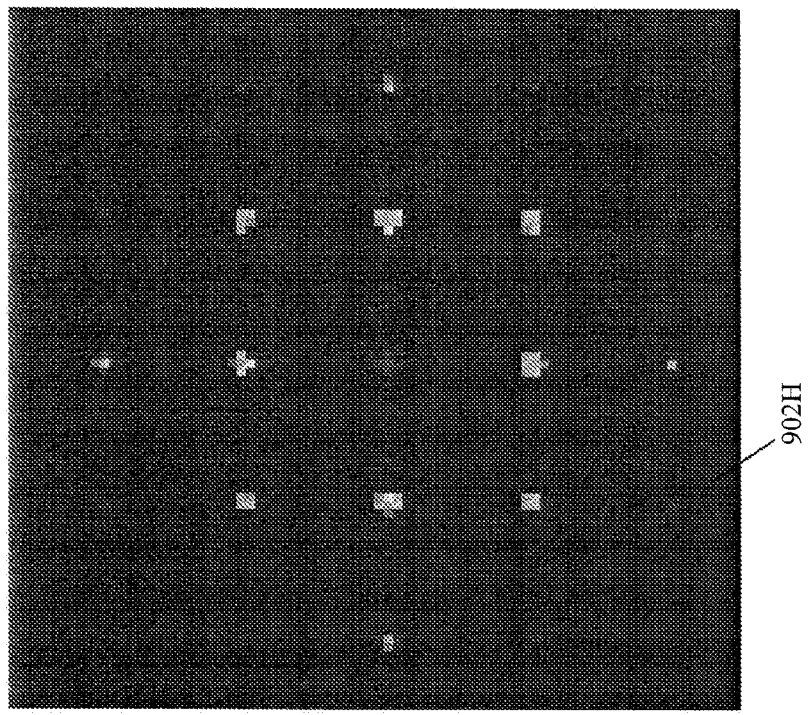
Figure 9G:
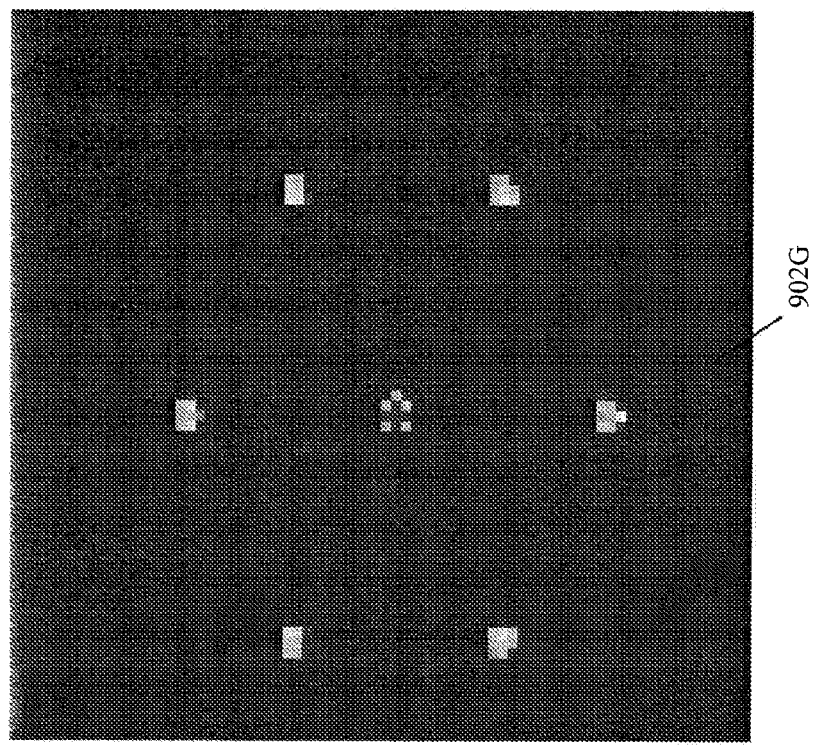
Figure 9I:
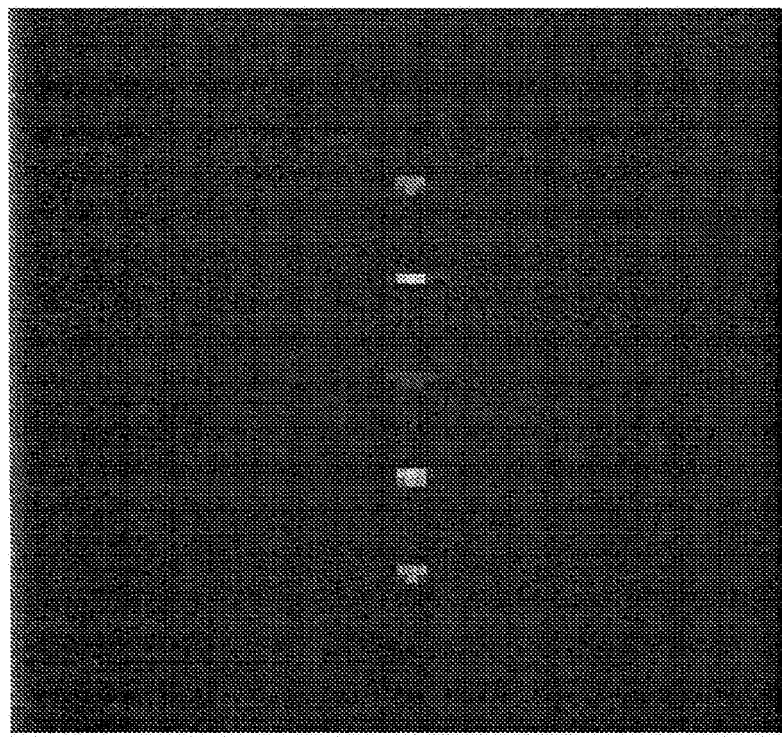
Figure 9J:
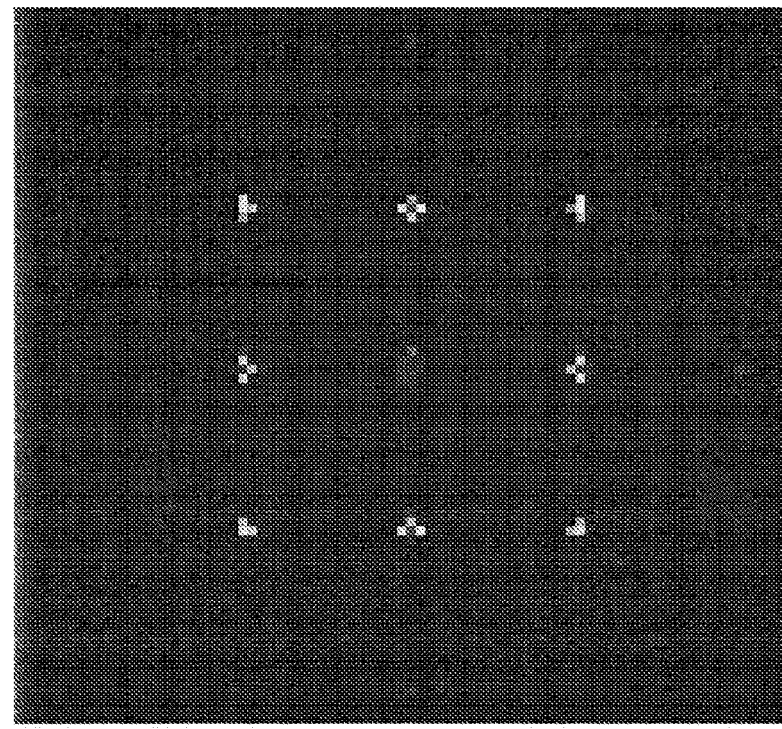
Figure 9L:
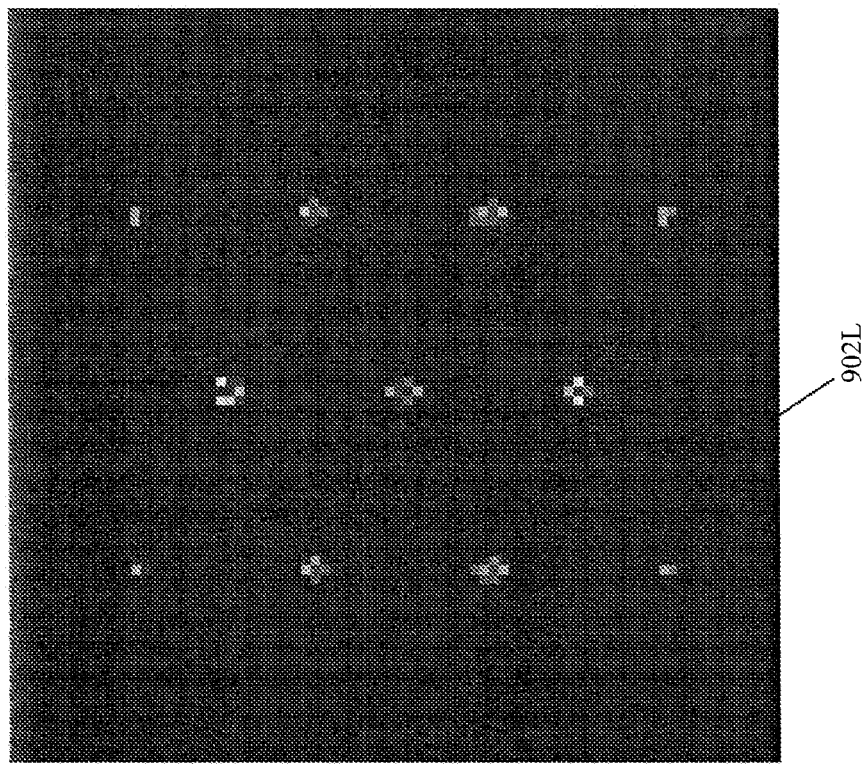
Figure 9K:
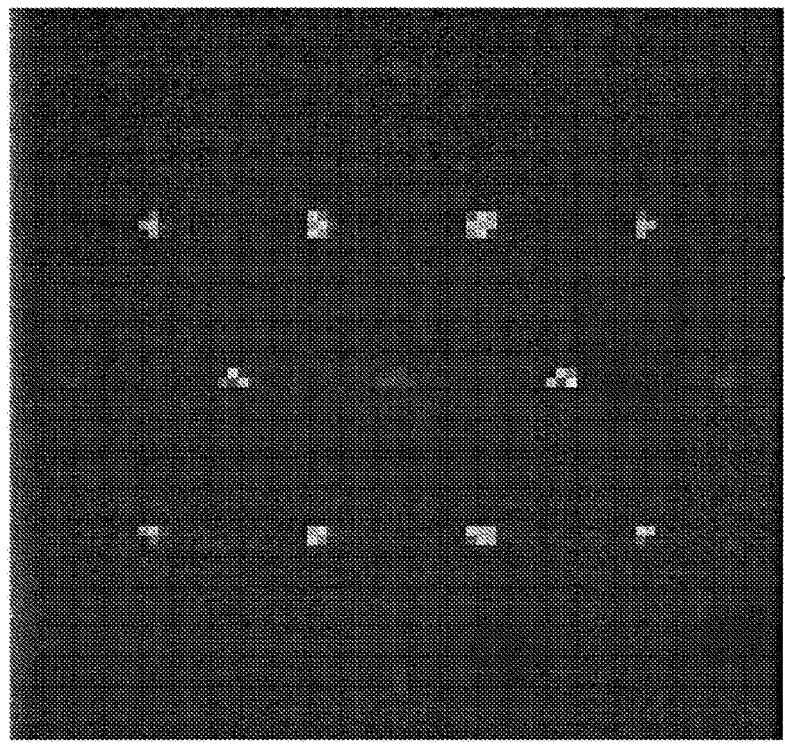
Figure 9N:
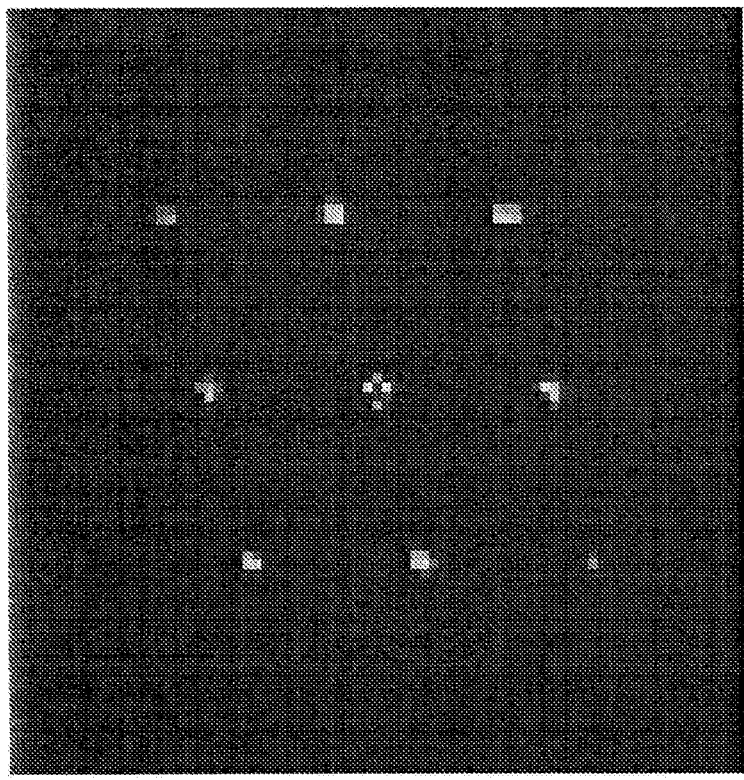
Figure 9M:
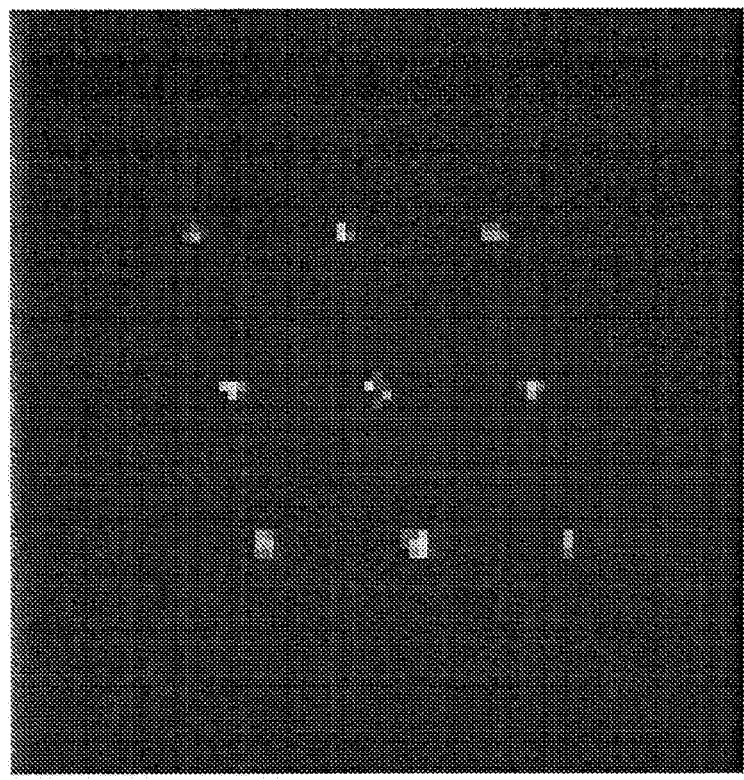
Figure 9O:
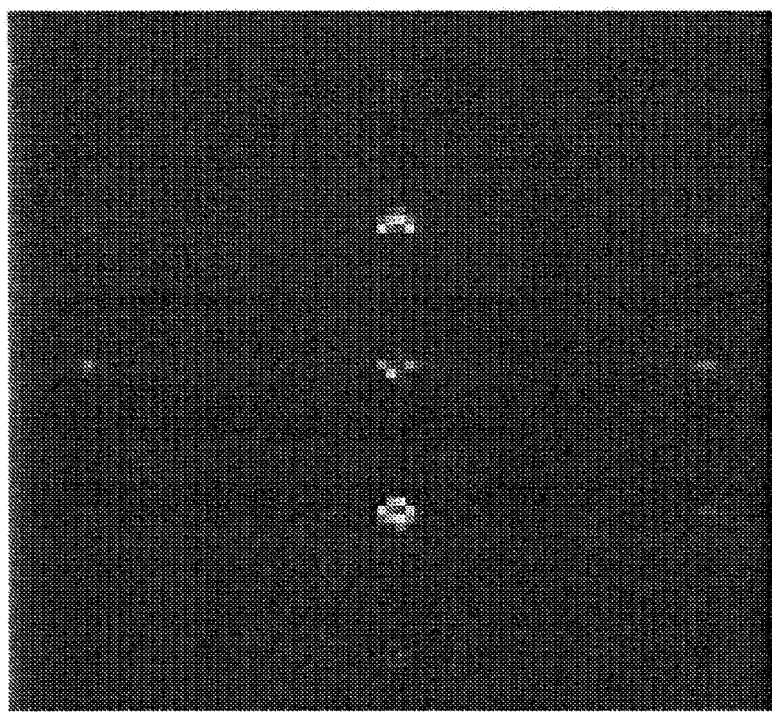

In step S808, one clip from each of the groups are selected. For example, S806 includes forming five to fifteen groups of clips, and one clip is randomly selected from each group. FIGS. 9A-N and 9O illustrate example diffraction order distributions 902A-N and 902O for fifteen individual clips that have been calculated from a set of full clips.

These clips are then used as the subset 306 in the example full-chip SMO flow of FIG. 3. In embodiments, two SRAM patterns from target design 300 are also included in the subset 306.

Some advantages of the diffraction order based pattern selection method described in connection with FIG. 8 versus the other methods are that no starting condition is required (e.g. starting illumination source), no resist model is required, and no models are required. It only requires the target pattern, so it is process-independent.

Figure 10:
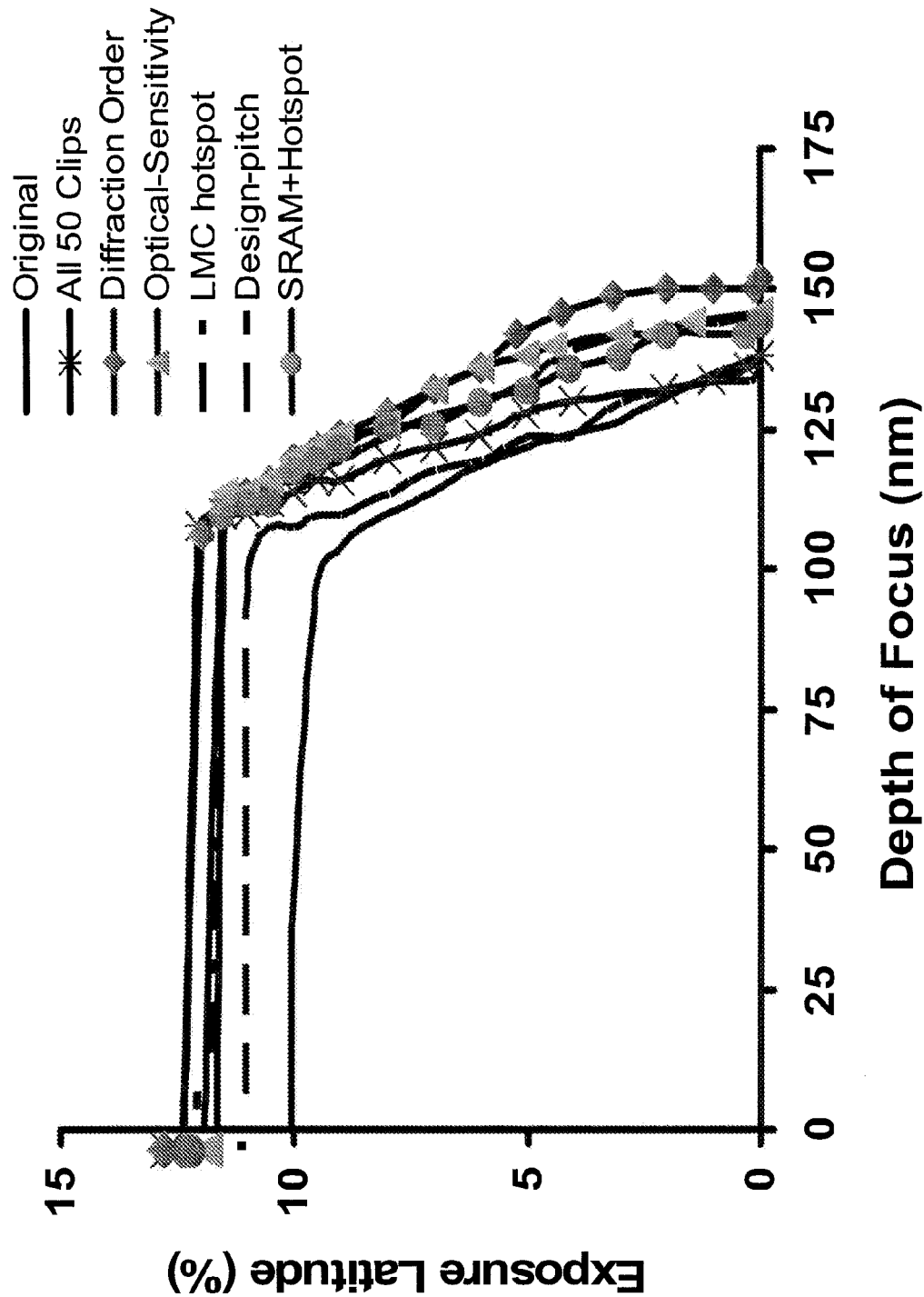
FIG. 10 is a graph comparing the process window performance for the various pattern selection methods according to the invention.

FIG. 10 is a graph comparing the process window performance for the various pattern selection methods described above, versus a conventional full-chip SMO method. As can be seen, all methods improve upon the original process window, with the diffraction order method giving the closest performance to the full-chip SMO.

Figure 11:
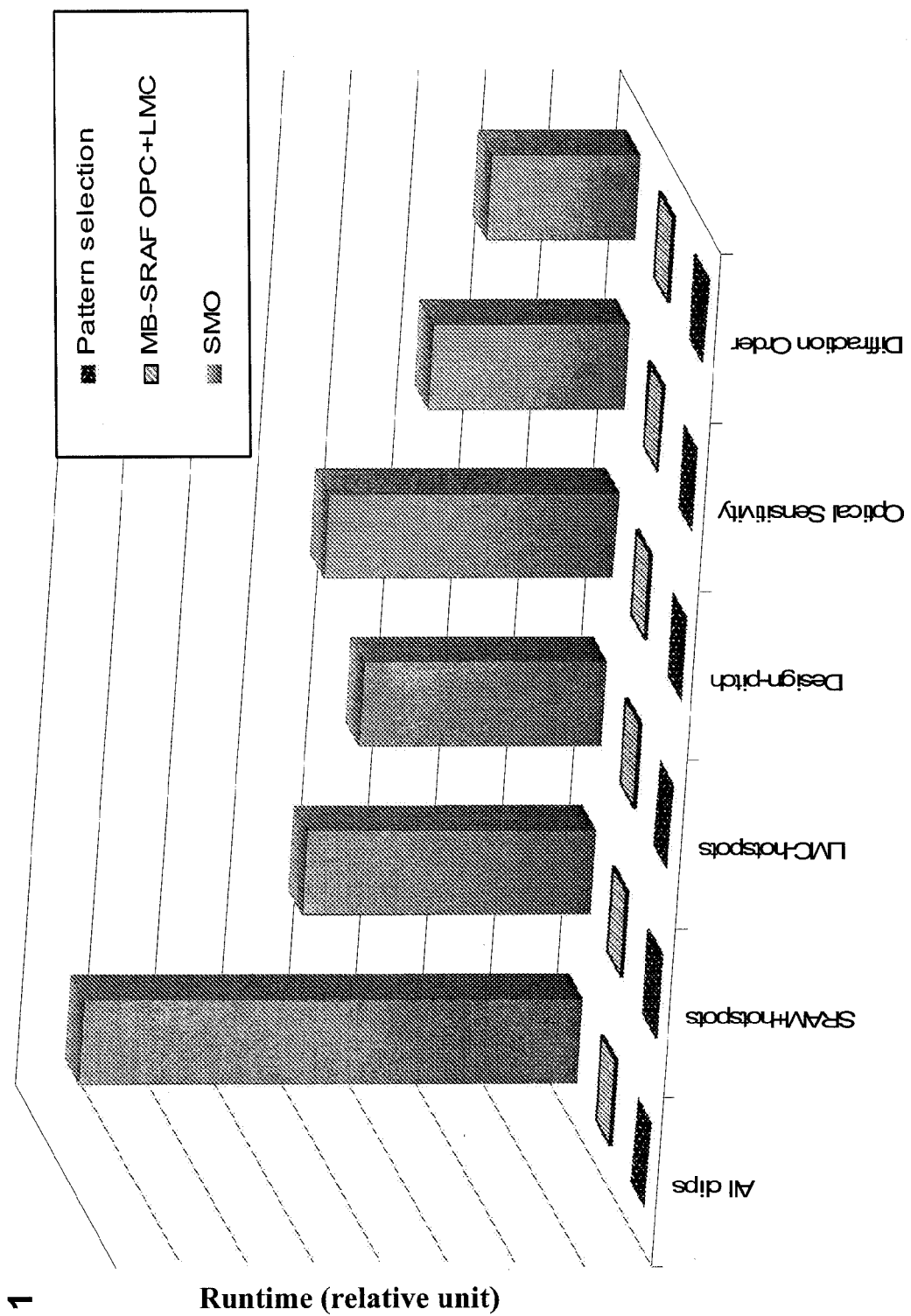
FIG. 11 is a chart comparing processing run time performance for the various pattern selection methods according to the invention.

FIG. 11 is a chart comparing processing run time performance for the various pattern selection methods described above, versus a conventional full-chip SMO method. As can be seen, all methods improve upon the conventional run time, with the diffraction order method giving the most improvement.

Figure 12:
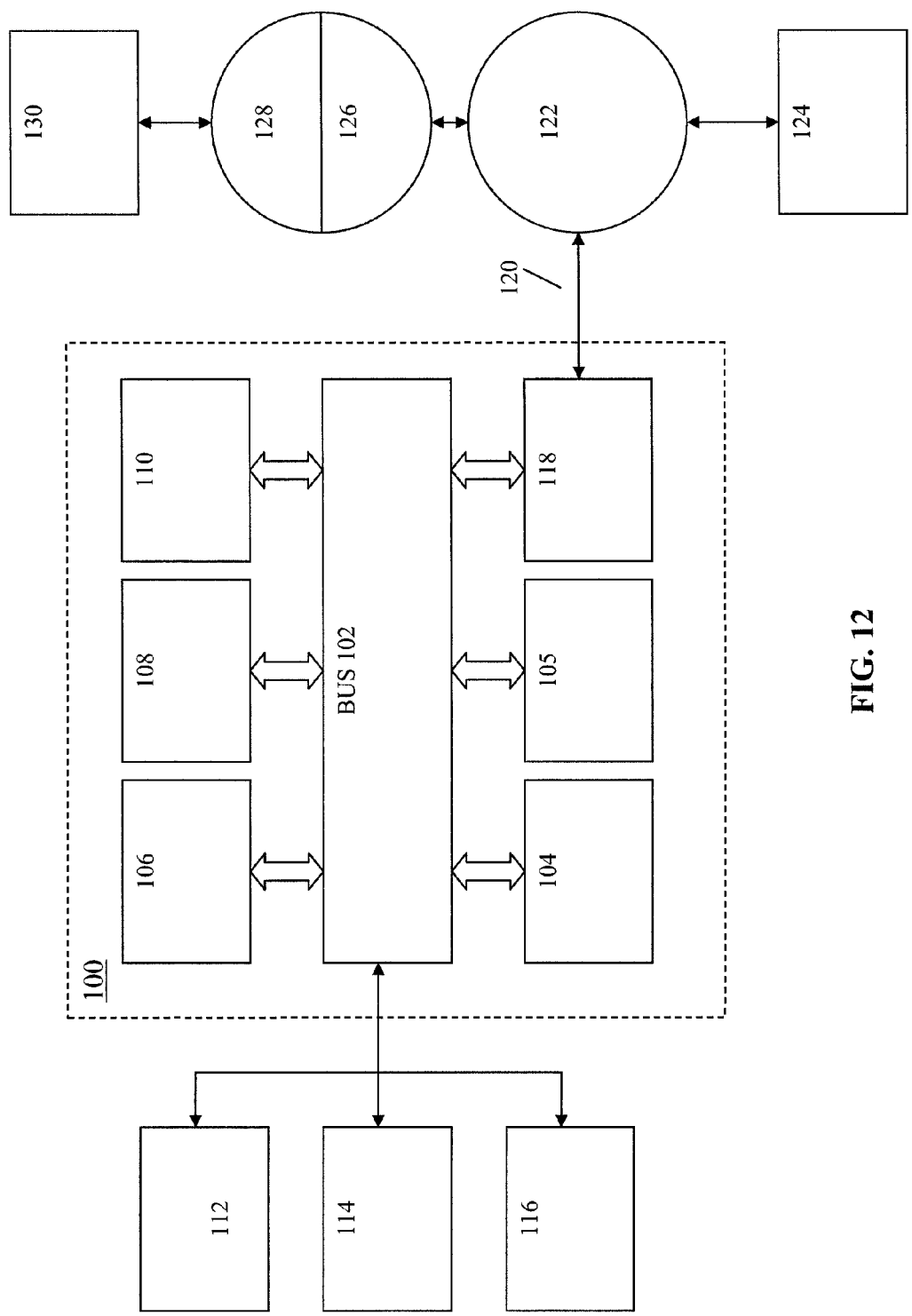
FIG. 12 is a block diagram that illustrates a computer system which can assist in the implementation of the simulation method of the present invention.

FIG. 12 is a block diagram that illustrates a computer system 100 which can assist in implementing the optimization methods and flows disclosed herein. Computer system 100 includes a bus 102 or other communication mechanism for communicating information, and a processor 104 (and a co-processor 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 13:
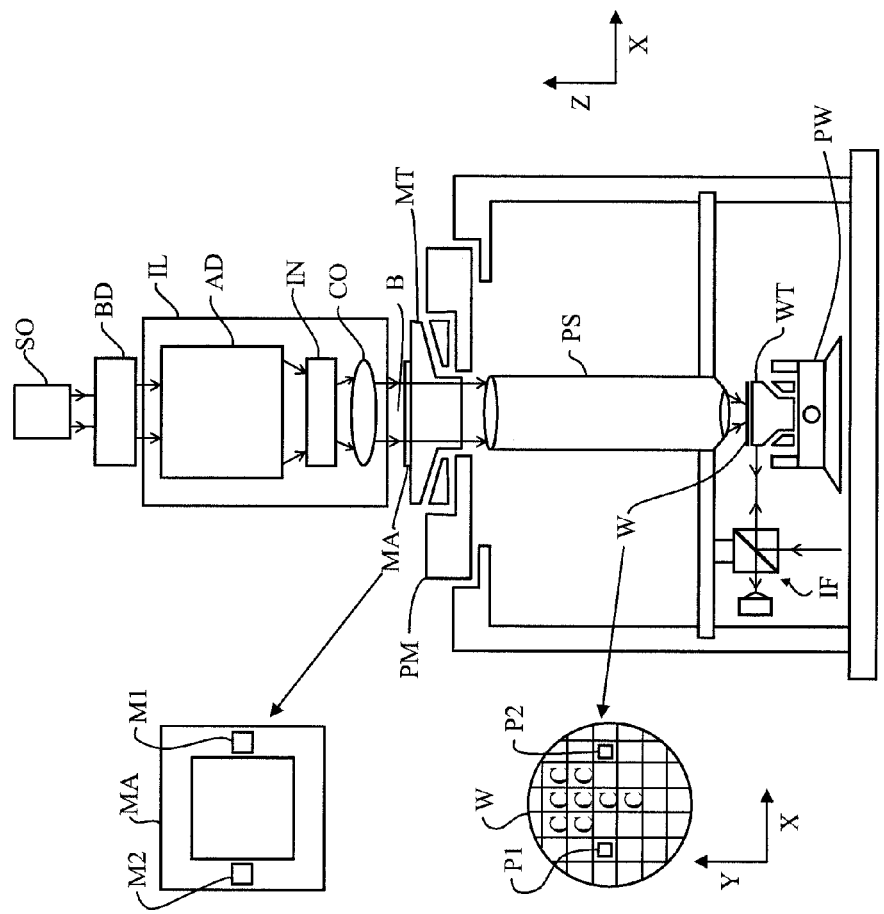
FIG. 13 schematically depicts a lithographic projection apparatus suitable for use with the method of the present invention.

FIG. 13 schematically depicts an exemplary lithographic projection apparatus whose illumination source could be optimized utilizing the processes of the present invention. The apparatus comprises:

a radiation system IL, for supplying a projection beam B of radiation. In this particular case, the radiation system also comprises a radiation source SO;

a first object table (mask table) MT provided with a mask holder for holding a mask MA (e.g., a reticle), and connected to first positioning means for accurately positioning the mask with respect to item PS;

a second object table (substrate table) WT provided with a substrate holder for holding a substrate W (e.g., a resist-coated silicon wafer), and connected to second positioning means for accurately positioning the substrate with respect to item PS;

a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 13 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam B onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 13. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the invention as described without departing from the scope of the claims set out below.

The invention may be further described using the following clauses:

1. A computer readable medium having instructions recorded thereon, which when read by a computer, causes the computer to perform a method for optimizing a lithographic process for imaging a portion of a design onto a substrate, the method comprising:

selecting a subset of patterns from the portion of the design;

optimizing an illumination source for the lithographic process for imaging the selected subset of patterns; and using the optimized illumination source for optimizing the portion of the design for being imaged in the lithographic process.

2. A computer readable medium according to clause 1, wherein the portion of the design comprises clips and wherein the step of selecting a subset of patterns comprises:

identifying a full set of clips from the design;

selecting a subset of clips from the full set of clips;

wherein the step of optimizing comprises optimizing an illumination source for the lithographic process for imaging the selected subset of clips; and wherein the step of using comprises using the optimized illumination source for optimizing the full set of clips for being imaged in the lithographic process.

3. A computer readable medium according to clause 1 or 2, wherein the selecting step includes:

calculating diffraction order distributions for the patterns in the portion of the design;

grouping said patterns into a plurality of groups based on the calculated diffraction order distributions; and selecting one or more representative patterns from each of the groups as the subset of patterns.

4. A computer readable medium according to clause 1 or 2, wherein the selecting step includes:

identifying one or more memory patterns in the portion of the design;

pre-optimizing the illumination source for the one or more memory patterns;

using the pre-optimized illumination source to determine potential hot spots in the portion of the design; and selecting the subset of patterns based on the determined potential hot spots.

5. A computer readable medium according to clause 1 or 2, wherein the selecting step includes:

identifying an original illumination source for the lithographic process;

using the original illumination source to determine potential hot spots in the portion of the design; and selecting the subset of patterns based on the determined potential hot spots.

6. A method according to clause 4 or 5, wherein the method further comprises a step of:

calculating a severity score for the hot spots; and selecting the hot spots having a predefined severity score or having a predefined severity score range.

7. A computer readable medium according to clause 1 or 2, wherein the selecting step includes:

grouping patterns in the portion of the design by design type into a plurality of groups;

sorting the patterns in each group by pitch and feature type to determine an optimal pattern in each group; and selecting the optimal pattern in each group as the subset of patterns.

8. A computer readable medium according to clause 1 or 2, wherein the selecting step includes:

identifying a simulation model of the lithographic process;

using the model to estimate process parameter sensitivities for patterns in the portion of the design; and selecting the subset of patterns based on the estimated process parameter sensitivities.

9. A computer readable medium according to any of the clauses 1 to 8, further comprising:
determining whether a lithographic process performance metric for the optimized subset of patterns is acceptable; and
if the determined metric is not acceptable, adding clips having potential hot spots to the subset and repeating the optimization steps.

10. A computer readable medium according to any of the clauses 1 to 9, wherein the step of optimizing the illumination source includes simulating a lithographic process performance using a model of the lithographic process, the illumination source, and the subset of patterns to determine whether the performance is acceptable.

11. A computer readable medium according to any the clauses 1 to 10, wherein the step of optimizing the portion of the design includes performing optical proximity correction on certain of the patterns based on the optimized illumination source.

12. A method for optimizing a lithographic process for imaging a portion of a design onto a substrate, the method comprising:
selecting a subset of patterns from the portion of the design;
optimizing an illumination source for the lithographic process for imaging the selected subset of patterns; and
using the optimized illumination source for optimizing the portion of the design for being imaged in the lithographic process.

13. A method according to clause 12, wherein the portion of the design comprises a full chip.

14. A method according to clause 12, wherein the portion of the design comprises clips and wherein the step of selecting a subset of patterns comprises:
identifying a full set of clips from the design;
selecting a subset of clips from the full set of clips;
wherein the step of optimizing comprises optimizing an illumination source for the lithographic process for imaging the selected subset of clips; and
wherein the step of using comprises using the optimized illumination source for optimizing the full set of clips for being imaged in the lithographic process.

15. A method according to clause 12, wherein the selecting step includes:
calculating diffraction order distributions for patterns in the portion of the design;
grouping said patterns into a plurality of groups based on the calculated diffraction order distributions; and
selecting one or more representative patterns from each of the groups as the subset of patterns.

16. A method according to clause 12, wherein the selecting step includes:
identifying one or more memory patterns in the portion of the design;
pre-optimizing the illumination source for the one or more memory patterns;
using the pre-optimized illumination source to determine potential hot spots in the portion of the design; and
selecting the subset of patterns based on the determined potential hot spots.

17. A method according to clause 12, wherein the selecting step includes:
identifying an original illumination source for the lithographic process;
using the original illumination source to determine potential hot spots in the portion of the design; and
selecting the subset of patterns based on the determined potential hot spots.

18. A method according to clause 16, wherein the method further comprises a step of:
calculating a severity score for a hot spot; and
selecting the hot spot having a predefined severity score or selecting the hot spot having a severity score within a predefined severity score range.

19. A method according to clause 17, wherein the method further comprises a step of:
calculating a severity score for a hot spot; and
selecting the hot spot having a predefined severity score or selecting the hot spot having a severity score within a predefined severity score range.

20. A method according to clause 12, wherein the selecting step includes:
grouping patterns in the portion of the design by design type into a plurality of groups;
sorting the patterns in each group by pitch and feature type to determine an optimal pattern in each group; and
selecting the optimal pattern in each group as the subset of patterns.

21. A method according to clause 12, wherein the selecting step includes:
identifying a simulation model of the lithographic process;
using the model to estimate process parameter sensitivities for patterns in the portion of the design; and
selecting the subset of patterns based on the estimated process parameter sensitivities.

22. A method according to clause 12, further comprising:
determining whether a lithographic process performance metric for the optimized subset of patterns is acceptable; and
if the determined metric is not acceptable, adding clips having potential hot spots to the subset of patterns and repeating the optimization steps.

23. A method according to clause 12, wherein the step of optimizing the illumination source includes simulating a lithographic process performance using a model of the lithographic process, the illumination source, and the subset of patterns to determine whether the performance is acceptable.

24. A method according to clause 12, wherein the step of optimizing the portion of the design includes performing optical proximity correction on certain of the patterns based on the optimized illumination source.

25. A computer readable medium having instructions recorded thereon, which when read by a computer, causes the computer to perform a method for optimizing a lithographic process for imaging a portion of a design onto a wafer according to clause 12.

26. A lithographic apparatus comprising:
an illumination system configured to provide a beam of radiation;
a support structure configured to support a patterning means, the patterning means serving to impart the radiation beam with a pattern in its cross-section;
a substrate table configured to hold a substrate; and
a projection system for projecting the patterned radiation beam onto a target portion of the substrate;
wherein the lithographic apparatus further comprises a processor for configuring the illumination system to generate the optimized illumination source according to the method for optimizing a lithographic process of clause 12.

27. A patterning means for imparting a radiation beam from an illumination system of a lithographic apparatus being configured for projecting this imparted beam via a projection system onto a target portion of a substrate, wherein the patterning means comprises an optimized portion of a design, wherein the optimized portion of the design is determined according to the method of optimizing a lithographic process of clause 12.

28. A method for optimizing a lithographic process for imaging a portion of a design onto a wafer, the method comprising:

identifying a full set of clips from the design;
selecting a subset of clips from the full set of clips;
optimizing an illumination source for the lithographic process for imaging the selected subset of clips; and
using the optimized illumination source for optimizing the full set of clips for being imaged in the lithographic process.

29. A method according to clause 28, wherein the selecting step includes:

calculating diffraction order distributions for each of the full set of clips;
grouping the full set of clips into a plurality of groups based on the calculated diffraction order distributions; and
selecting one or more representative clips from each of the groups as the subset.

30. A method according to clause 29, wherein the selecting step includes:

identifying one or more memory patterns in the full set of clips;
pre-optimizing the illumination source for the one or more memory patterns;
using the pre-optimized illumination source to determine potential hot spots in the full set of clips; and
selecting the subset based on the determined potential hot spots.

31. A method according to clause 28, wherein the selecting step includes:

identifying an original illumination source for the lithographic process;
using the original illumination source to determine potential hot spots in the full set of clips; and
selecting the subset based on the determined potential hot spots.

32. A method according to clause 28, wherein the selecting step includes:

grouping patterns in the full set of clips by design type into a plurality of groups;
sorting the patterns in each group by pitch and feature type to determine an optimal pattern in each group; and
selecting the optimal pattern in each group as the subset.

33. A method according to clause 28, wherein the selecting step includes:

identifying a simulation model of the lithographic process;
using the model to estimate process parameter sensitivities for each of the full set of clips; and
selecting the subset based on the estimated process parameter sensitivities.

The invention claimed is:

1. A method of configuring a lithographic process of imaging a portion of a design layout onto a substrate, the method comprising:

evaluating, by a hardware computer system, a lithographic process performance of a set of patterns from the portion of the design layout in conjunction with an illumination configuration;

based on the evaluated performance, identifying at least one of the patterns as a potential hot spot that has a process window limiting effect for the lithographic process; and modifying, by the computer system, the illumination configuration and/or the portion of the design layout based on a subset of the patterns, the subset including the at least one pattern identified as a potential hotspot.

2. The method of claim 1, wherein evaluating the lithographic process performance and/or modifying the illumination configuration and/or the portion of the design layout, comprises simulating the lithographic process using a model of the lithographic process and one or more of the patterns.

3. The method of claim 1, wherein evaluating the lithographic performance comprises determining whether each pattern of the set of patterns will print within a desired process window for the lithographic process.

4. The method of claim 3, wherein the desired process window comprises a parameter of exposure latitude and/or depth of focus.

5. The method of claim 1, wherein the portion of the design layout comprises a full chip.

6. The method of claim 1, wherein identifying at least one of the patterns as a potential hot spot further comprises:

calculating a severity score for a potential hot spot; and
selecting the potential hot spot having a predefined severity score or selecting the hot spot having a severity score within a predefined severity score range.

7. The method of claim 1, wherein identifying at least one of the patterns as a potential hot spot comprises evaluating edge placement error and/or mask error enhancement factor of the patterns.

8. The method of claim 1, further comprising evaluating, by a computer system, lithographic process performance of the modified illumination configuration and/or portion of the design layout and based on the evaluated performance of the modified illumination configuration and/or portion of the design layout, identifying at least one further pattern as a potential hot spot, and modifying the illumination configuration and/or the portion of the design layout based on at least the further pattern.

9. The method of claim 1, further comprising, prior to the evaluating the lithographic process performance of the set of patterns:

evaluating, by a computer system, lithographic process performance of a full set of clips for the portion of the design layout;
based on the evaluated performance of the full set of clips, identifying at least one of the clips as a potential hot spot; and
modifying, by the computer system, an illumination configuration and/or the portion of the design layout based on a subset of the clips, the subset including the at least one clip identified as a potential hotspot,
wherein the set of patterns comprises the full set of clips.

10. The method of claim 1, further comprising verifying the manufacturability of the subset of patterns in conjunction with the modified illumination configuration and/or portion of the design layout.

11. The method of claim 1, further comprising:

using a simulation model of the lithographic process to estimate process parameter sensitivities for each pattern of the set of patterns; and
selecting at least one pattern for inclusion in the subset based on the estimated process parameter sensitivities.

12. The method of claim 1, comprising modifying the portion of the design layout, wherein modifying the portion of the design layout comprises performing optical proximity correction on certain of the patterns of the portion of the design layout and/or placing sub-resolution assist features within the portion of the design layout.

13. The method of claim 1, comprising modifying the portion of the design layout to optimize the portion of the design layout with the illumination configuration or a modified illumination configuration.

14. A patterning device structure configured to impart a pattern to a radiation beam from an illumination system of a lithographic apparatus that is configured to project the radiation beam with the imparted pattern via a projection system onto a target portion of a substrate, wherein the patterning device structure comprises an optimized portion of a design layout, the optimized portion determined by the method of claim 13.

15. A computer program product comprising a non-transitory computer readable medium having instructions thereon, the instructions, when executed by a computer system, implement the method of claim 1.

16. A method of configuring a lithographic process of imaging a portion of a design layout onto a substrate, the method comprising:
    obtaining a full set of clips from the portion of the design layout;
    identifying, by a hardware computer system, at least one clip from the full set of the clips as a potential hot spot that has a process window limiting effect for the lithographic process, based on a lithographic process performance of the full set of clips; and
    optimizing, by the hardware computer system, an illumination configuration and/or the portion of the design layout based on a subset of the full set of clips, the subset including the at least one clip identified as a potential hotspot.

17. The method of claim 16, wherein the identifying and/or the optimizing, comprises simulating the lithographic process using a model of the lithographic process and one or more of the clips.

18. The method of claim 16, wherein the identifying comprises determining whether each clip of the full set of clips will print within a desired process window for the lithographic process.

19. The method of claim 16, wherein identifying at least one clip as a potential hot spot further comprises:
    calculating a severity score for a potential hot spot; and
    selecting the potential hot spot having a predefined severity score or selecting the hot spot having a severity score within a predefined severity score range.

20. A computer program product comprising a non-transitory computer readable medium having instructions thereon, the instructions, when executed by a computer system, implement the method of claim 16.

* * * * *